United States Patent
Kodama

(10) Patent No.: US 9,776,321 B2
(45) Date of Patent: Oct. 3, 2017

(54) POSTURE HOLDING DEVICE FOR HOLDING PART

(71) Applicant: TOKYO ELECTRON LIMITED, Tokyo (JP)

(72) Inventor: Toshiaki Kodama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/212,838

(22) Filed: Jul. 18, 2016

(65) Prior Publication Data

US 2017/0028547 A1     Feb. 2, 2017

(30) Foreign Application Priority Data

Jul. 28, 2015  (JP) ................................. 2015-148521

(51) Int. Cl.
| | |
|---|---|
| *B25J 9/18* | (2006.01) |
| *B25J 9/00* | (2006.01) |
| *B25J 9/10* | (2006.01) |
| *H01L 21/677* | (2006.01) |

(52) U.S. Cl.
CPC ............ *B25J 9/0048* (2013.01); *B25J 9/102* (2013.01); *H01L 21/67742* (2013.01)

(58) Field of Classification Search
USPC ............. 318/560, 568.11, 568.2, 568.21, 45; 74/490.01, 490.05, 490.08, 490.13; 414/187, 935–941, 751.1, 753.1
See application file for complete search history.

(56) References Cited

U.S. PATENT DOCUMENTS

| | | | | |
|---|---|---|---|---|
| 5,789,878 A | * | 8/1998 | Kroeker | B25J 9/107 318/45 |
| 5,894,760 A | * | 4/1999 | Caveney | B25J 18/04 310/114 |
| 6,155,131 A | * | 12/2000 | Suwa | B25J 9/107 74/490.01 |
| 8,267,636 B2 | * | 9/2012 | Hofmeister | B25J 9/106 414/744.5 |
| 2012/0128450 A1 | * | 5/2012 | Caveney | H01L 21/67742 414/217 |

(Continued)

FOREIGN PATENT DOCUMENTS

| | | |
|---|---|---|
| JP | 06-15592 A | 1/1994 |
| JP | 2002-134584 A | 5/2002 |

(Continued)

*Primary Examiner* — Jorge L Carrasquillo
(74) *Attorney, Agent, or Firm* — Nath, Goldberg & Meyer; Jerald L. Meyer

(57) ABSTRACT

A posture holding device is for use in a transfer device which has a holding part configured to hold an object and a first link and a second link connected to the holding part. The transfer device moves the first link and the second link relative to the holding part so as to move the holding part between a transfer position and a standby position. The posture holding device holds a posture of the holding part and includes a magnetic gear rotatably connecting the first link and the second link to the holding part. The magnetic gear is disposed such that the one end of the first link connected to the holding part is rotated about a first axis and the one end of the second link connected to the holding part is rotated about the first axis or a second axis different from the first axis.

4 Claims, 14 Drawing Sheets

(56) References Cited

U.S. PATENT DOCUMENTS

| 2013/0216335 A1* | 8/2013 | Hiroki | ............... | B25J 9/107 |
| | | | | 414/217 |
| 2014/0209241 A1* | 7/2014 | Hiroki | ............... | H01L 21/67161 |
| | | | | 156/345.31 |

FOREIGN PATENT DOCUMENTS

| JP | 2012-061568 A | 3/2012 |
| KR | 10-2008-0026623 A | 3/2008 |

* cited by examiner

POSTURE HOLDING DEVICE FOR HOLDING PART

CROSS-REFERENCE TO RELATED APPLICATION

This application claims the benefit of Japanese Patent Application No. 2015-148521, filed on Jul. 28, 2015, in the Japan Patent Office, the disclosure of which is incorporated herein in its entirety by reference.

TECHNICAL FIELD

The present disclosure relates to a transfer device for transferring a target object to be transferred, and more particularly, to a posture holding device of a holding part in a transfer device for transferring an object to be processed, such as semiconductor wafers, substrates for liquid crystals, and organic electroluminescent devices, into a processing chamber.

BACKGROUND

For example, in processes of manufacturing semiconductor devices, liquid crystal panels or the like, various processes such as deposition processes, etching processes and oxidizing processes on objects to be processed such as semiconductor substrates or substrates for liquid crystals (hereinafter, the semiconductor substrates or the substrates for liquid crystals are simply referred to as wafers W) are performed in separate processing chambers. When the objects to be processed are transferred between the processing chambers, a transfer device having a holding part for holding the objects to be processed has been normally used. There are various types of transfer devices, where a transfer device for reciprocating the holding part by extending or contracting a multi-articulated arm has been widely used, for example.

For example, a transfer device having a multi-articulated arm has been disclosed in the related art. The transfer device has two links and two arms, which are combined in a rhombus shape, where a holding part for holding an object to be processed is rotatably connected to ends of the two links, and a driving mechanism such as a motor is connected to ends of the two arms. As the two links connected to the driving mechanism are rotated in opposite directions, the holding part may be operated to be extended and contracted.

In this transfer device, the object to be processed is required to be transferred with high accuracy to a desired position within a processing chamber. However, only the rotatable connection of the holding part to the ends of the two links cannot consistently maintain a rotational position of the holding part, so that it is difficult to transfer the object to be processed with high accuracy. Accordingly, as a posture holding device for holding a posture of the holing part in a desired state in this transfer device, there has been suggested a posture holding device in which the ends of additional posture-holding links are rotatably connected to the two links on the side of the holding part, respectively, while the opposite ends of the additional posture-holding links are connected respectively to a pair of rollers arranged in a vertical direction, and the rollers are inserted into a pair of rails.

Further, in order to hold the posture of the holding part, it has been known in the related art that gears are installed at respective leading ends of the two links rotatably connected to the holding part, respectively. These two gears are caused to be engaged with each other so as to synchronize the two links, thereby holding the posture of the holding part connected to the links.

However, in the transfer device described above, there may be a case in which control problem or mechanical problem causes the holding part to deviate from a predetermined route, thereby resulting in a trouble in that the holding part comes into contact with a wall surface of the processing chamber, for example. In this case, a moment is applied to the holding part in contact with the wall surface of the processing chamber, for example. However, the moment applied to the holding part cannot be avoided since the transfer device is equipped with the posture holding device for holding the posture of the holding part as described above. As a result, excessive torque may be exerted to the holding part or the posture holding device, leading to concern for breakage of the transfer device.

SUMMARY

Some embodiments of the present disclosure provide a technique for preventing the transfer device from being broken due to the excessive torque exerted to the holding part of the transfer device.

According to one embodiment of the present disclosure, there is provided a posture holding device for use in a transfer device, the transfer device having a holding part configured to hold an object to be transferred, a first link with one end connected to the holding part, and a second link with one end connected to the holding part, the transfer device being configured to move the first link and the second link relative to the holding part so as to move the holding part between a transfer position and a standby position, the posture holding device being configured to hold a posture of the holding part, the posture holding device including: a magnetic gear configured to rotatably connect the one end of the first link and the one end of the second link to the holding part, wherein the magnetic gear is disposed such that the one end of the first link connected to the holding part is rotated about a first axis and the one end of the second link connected to the holding part is rotated about the first axis or a second axis different from the first axis.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
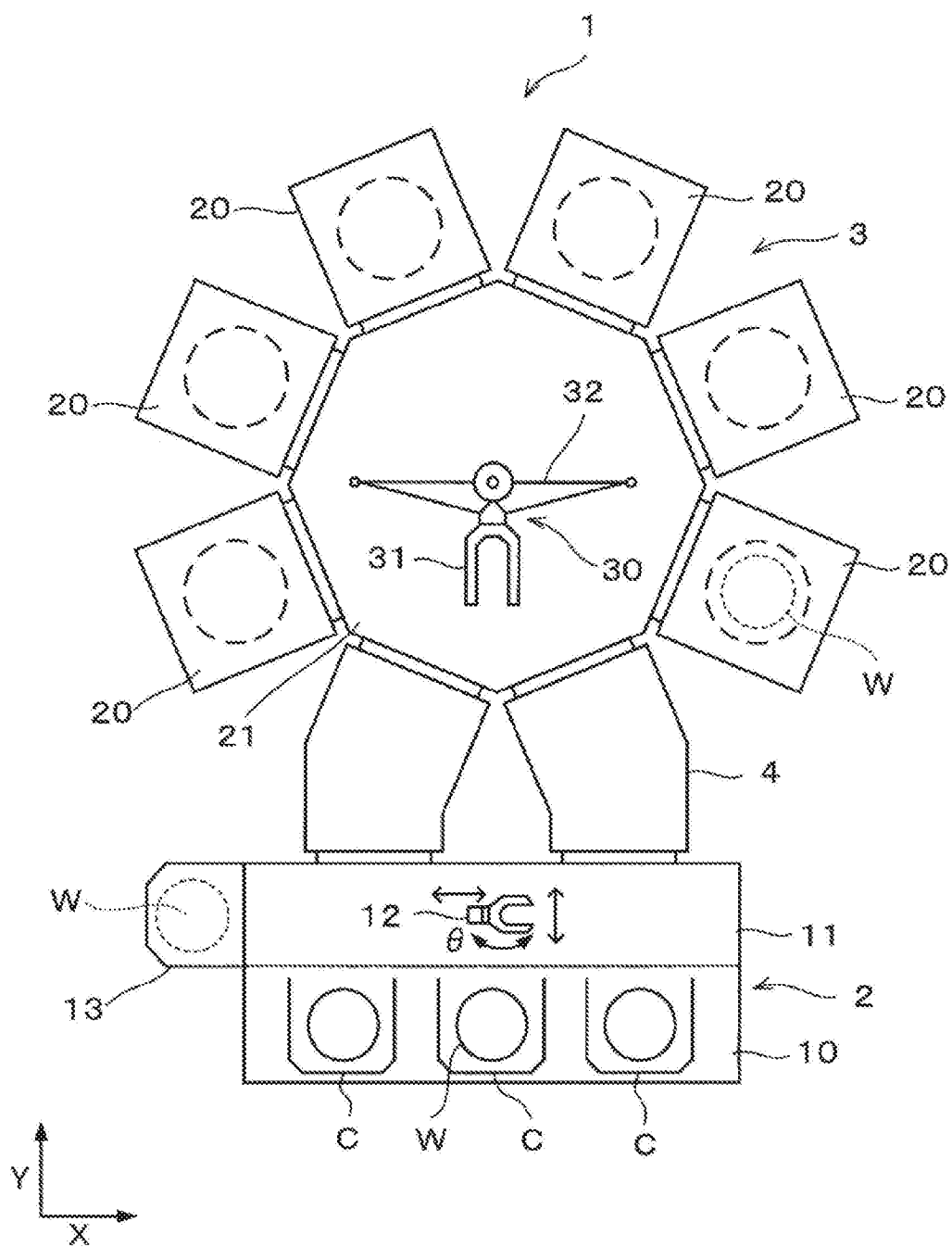
FIG. 1 is a plan view schematically illustrating a configuration of a substrate processing system 1 employing a wafer transfer device having a posture holding device according to the present disclosure.

Hereinafter, embodiments of the present disclosure will be described with reference to the accompanying drawings. In the description and the drawings, like reference numerals are assigned to the components having substantially like functions and configuration and descriptions therefor will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a plan view schematically illustrating a configuration of a substrate processing system 1 employing a transfer device having a posture holding device according to the present disclosure.

The substrate processing system 1 has a cassette station 2 for performing carry-in/out operations for wafers W with respect to the substrate processing system 1 on a cassette C basis, and a processing station 3 for processing objects to be processed, e.g., wafers W. The cassette station 2 and the processing station 3 are configured to be integrally connected to each other via load lock chambers 4.

The cassette station 2 has a cassette loading part 10 and a transfer chamber 11 installed near the cassette loading part 10. A plurality of cassettes C, e.g., 3 cassettes, each of which can accommodate a plurality of wafers W may be loaded to be arranged in an X direction (in a right and left direction in FIG. 1) in the cassette loading part 10. A wafer transfer arm 12 is installed in the transfer chamber 11. The wafer transfer arm 12 may move in an up and down direction, in the right and left direction, and in a circumferential direction (θ direction) around a vertical axis, and may transfer the wafers W between the cassettes C of the cassette loading part 10 and the load lock chambers 4. An alignment apparatus 13 for performing positioning of the wafers W by recognizing notches or the like of the wafers W is installed at an end of the transfer chamber 11 in a negative X direction.

The processing station 3 has a plurality of processing chambers 20 for processing the wafers W, and a vacuum transfer chamber 21 in the shape of a polygon (in the illustrated example, octagon). Each of the processing chambers 20 is disposed to surround the vacuum transfer chamber 21. Further, the load lock chamber 4 is connected to the vacuum transfer chamber 21.

A wafer transfer device 30 for transferring the wafers W is installed within the vacuum transfer chamber 21. The wafer transfer device 30 has a fork 31 as a holding part for holding the wafer W and a plurality of pivotable and extendable/retractable multi-articulated arms 32, and the wafer transfer device 30 may transfer the wafers W among the load lock chambers 4, the vacuum transfer chamber 21 and the processing chambers 20.

Figure 2:
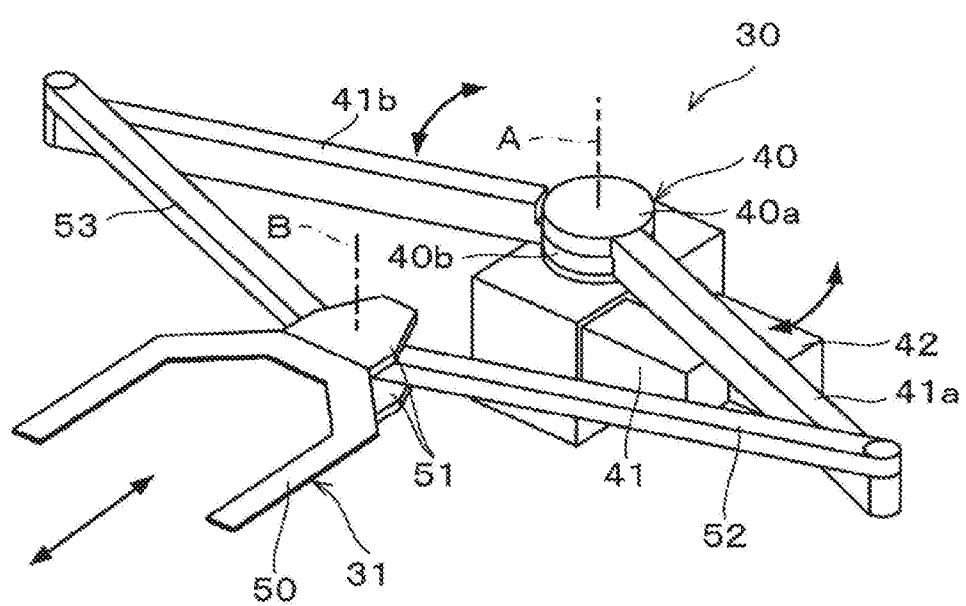
FIG. 2 is a perspective view schematically illustrating a configuration of the wafer transfer device having the posture holding device according to the present disclosure.

For example, as shown in the perspective view of FIG. 2, the wafer transfer device 30 has a first arm 41a having a center A of a central hub 40 as its rotation axis and a second arm 41b equally having the center A as its rotation axis. The central hub 40 has an upper hub 40a and a lower hub 40b that is disposed on an underside of the upper hub 40a and rotatable independently from the upper hub 40a. The upper hub 40a and the lower hub 40b are connected to a first motor 41 and a second motor 42, respectively, via concentric rotating members (not shown). Further, one end of the first arm 41a and one end of the second arm 41b are connected, for example, to the upper hub 40a and the lower hub 40b, respectively. For this reason, the first arm 41a and the second arm 41b are configured to rotate about the center A of the central hub 40 serving as their rotation axis by the first motor 41 and the second motor 42, respectively. Further, each of the first motor 41 and the second motor 42 may freely rotate in clockwise and counterclockwise directions.

The fork 31 as the holding part has a substantially U-shaped main body 50 and a supporting plate 51 for supporting the main body 50. The main body 50 is connected to the supporting plate 51, for example, by a fastening member (not shown) such as a bolt.

One end of the first link 52 and one end of the second link 53 are rotatably connected respectively to the supporting plate 51 via a magnetic gear 60 to be described later. The other end of the first link 52, which is opposed to the end thereof connected to the supporting plate 51, is rotatably connected to the other end of the first arm 41a which is opposed to the end thereof connected to the upper hub 40a. Similarly, the other end of the second link 53, which is opposed to the end thereof connected to the supporting plate 51, is rotatably connected to the other end of the second arm 41b which is opposed to the end thereof connected to the lower hub 40b. The fork 31, the first and second links 52 and 53, and the first and second arms 41a and 41b may construct the so-called frog-leg type wafer transfer device 30. When the first motor 41 and the second motor 42 are manipulated such that the first arm 41a and the second arm 41b may be rotated in opposite directions, i.e., the upper hub 40a and the lower hub 40b may be rotated in opposite directions, the fork 31 may be operated to be extended and/or retracted.

Figure 3:
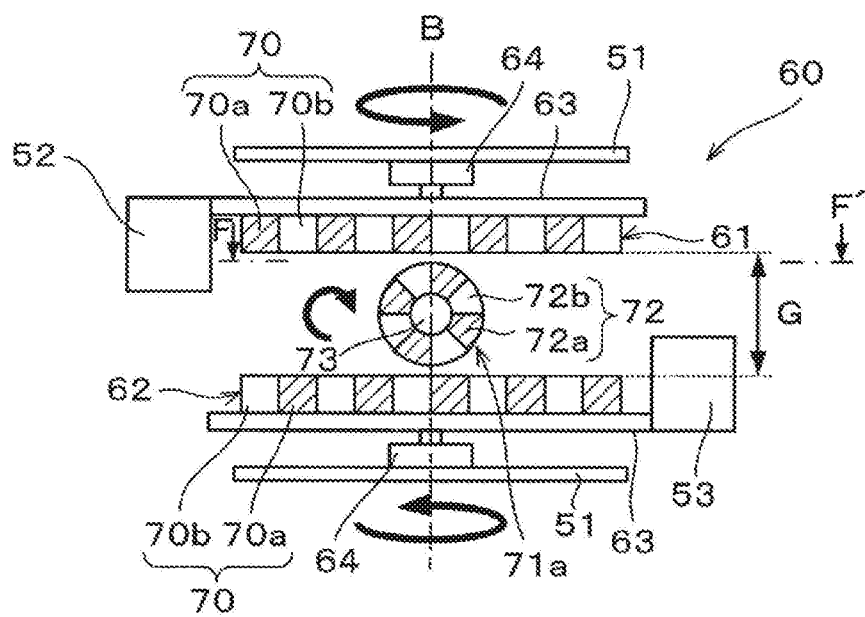
FIG. 3 is an explanatory side view schematically illustrating a configuration around a magnetic gear.
Figure 4:
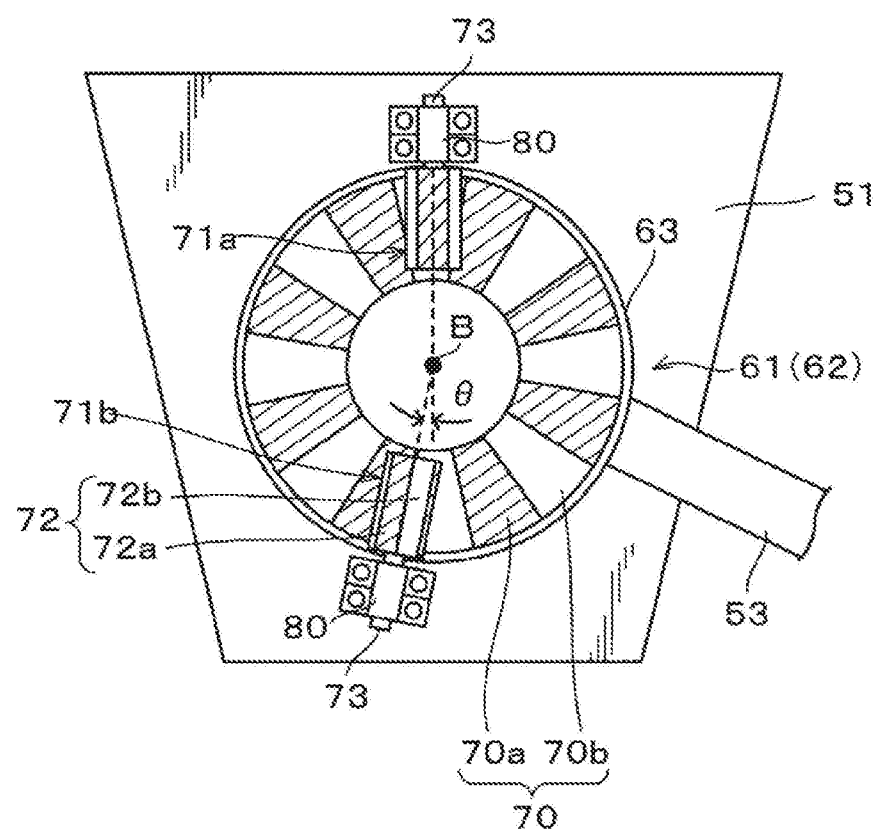
FIG. 4 is a sectional view taken along line F-F' of FIG. 3 and shown in a direction designated by arrows, schematically illustrating the configuration around the magnetic gear.
Figure 5:
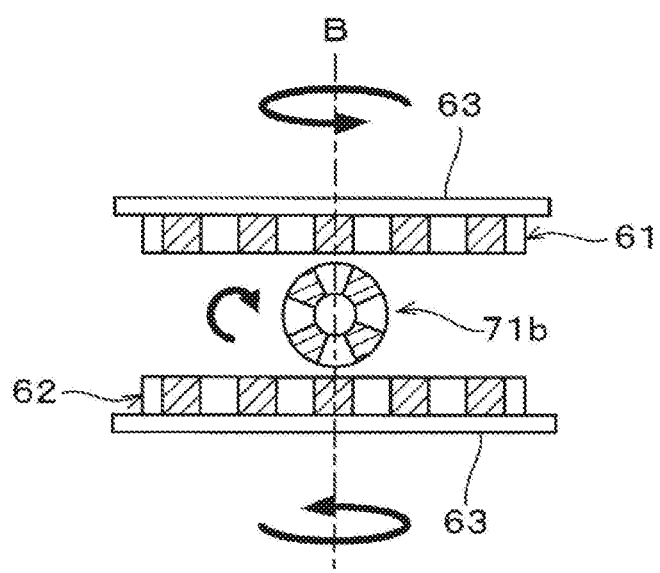
FIG. 5 is an explanatory side view illustrating a positional relationship between first and second magnetic bodies and a third magnetic body.

Then, the magnetic gear 60 for connecting the supporting plate 51 to the first and second links 52 and 53 will be described with reference to FIGS. 3, 4 and 5. FIG. 3 is an explanatory side view schematically illustrating a configuration around the magnetic gear 60, and FIG. 4 is a sectional view taken along line F-F' of FIG. 3 and shown in a direction designated by arrows, schematically illustrating the configuration around the magnetic gear 60. For example, as shown in FIG. 3, the magnetic gear 60 has a pair of first and second magnetic bodies 61 and 62, which are disposed to be opposed to each other on an identical central axis B and have a disc-like shape with a generally identical diameter. Each of the first and second magnetic bodies 61 and 62 may be configured, for example, by placing a plurality of magnetic pole pairs 70 on a disc-shaped supporting plate 63 equidistantly in a circumferential direction, where each of the magnetic pole pairs 70 consists of a generally fan-shaped N-pole magnet 70a and a generally fan-shaped S-pole magnet 70b. Further, the first and second magnetic bodies 61 and 62 are disposed to be spaced apart from each other by a predetermined gap G such that the respective magnetic pole pairs 70 are opposed to each other. That is, the first and second magnetic bodies 61 and 62 have a fully identical configuration except that relationships in the up and down direction between the supporting plate 63 and the magnetic pole pairs 70 are different from each other. Further, in FIGS. 3 and 4, the N-pole magnets 70a are represented by diagonally hatched portions while the S-pole magnets 70b are represented by non-hatched portions, for example.

The supporting plate 63 of the first magnetic body 61 is connected to the supporting plate 51 via a thrust bearing 64 having a rotational axis that is the central axis B. Accordingly, the first magnetic body 61 is configured to rotate about the central axis B with respect to the supporting plate 51. Similarly, the supporting plate 63 of the second magnetic body 62 is also connected to the supporting plate 51 via the thrust bearing 64 having a rotational axis that is the central axis B. Accordingly, the second magnetic body 62 is also configured to rotate about the central axis B with respect to the supporting plate 51. As exemplarily shown in FIG. 3, the first link 52 is connected to the first magnetic body 61, e.g., the supporting plate 63 thereof, while the second link 53 is connected to the supporting plate 63 of the second magnetic body 62. With this, the first link 52 and the second link 53 are rotatably connected to the supporting plate 51, i.e., to the fork 31 as the holding part, via the supporting plate 63 and the thrust bearing 64.

Cylindrical third magnetic bodies 71a and 71b are disposed, for example, at two locations between the first and second magnetic bodies 61 and 62 such that they are in parallel with surfaces of the first and second magnetic bodies 61 and 62. The third magnetic bodies 71a and 71b have an identical configuration. As exemplarily shown in FIGS. 3 and 4, each of the third magnetic bodies 71a and 71b is configured by placing a plurality of magnetic pole pairs 72 equidistantly along an outer peripheral surface of a cylindrical supporting shaft 73, where each of the magnetic pole pairs 72 consists of a generally rectangular N-pole magnet 72a and a generally rectangular S-pole magnet 72b, which have a generally arcuate cross-section and a predetermined length. As exemplarily shown in FIG. 4, the supporting shaft 73 is connected to the supporting plate 51 via a radial bearing 80. Further, FIGS. 3 and 4 show a state where each of the third magnetic bodies 71a and 71b is composed of four magnetic pole pairs 72 (four N-pole magnets 72a and four S-pole magnets 72b).

The magnetic pole pairs 70 that constructs the first and second magnetic bodies 61 and 62, and the magnetic pole pairs 72 that constructs the third magnetic bodies 71a and 71b are arranged with a generally identical pitch. Further, predetermined gaps are defined between the first and second magnetic bodies 61 and 62 and the third magnetic bodies 71a and 71b, and these gaps are set such that predetermined attractive forces may be interacted between the first and second magnetic bodies 61 and 62 and the third magnetic bodies 71a and 71b by magnetic forces of the respective magnetic pole pairs 70 and 72. Accordingly, for example, when the third magnetic body 71a is rotated by one revolution, i.e., by an angular amount corresponding to the four magnetic pole pairs 72, the first and second magnetic bodies 61 and 62 are rotated about the central axis B by an angle corresponding to the four magnetic pole pairs 70. At this time, the first and second magnetic bodies 61 and 62 are rotated in opposite directions. That is, for example, when the third magnetic body 71a is rotated clockwise from the state shown in FIG. 3, the first magnetic body 61 is rotated, for example, from the left to the right in FIG. 3, while the second magnetic body 62 is rotated from the right to the left. Further, as the first and second magnetic bodies 61 and 62 are rotated, the third magnetic body 71b on the other side is also rotated clockwise as in the third magnetic body 71a. In this case, it can be said, for example, that a pair of magnetic gears are configured with the first magnetic body 61 and the third magnetic bodies 71a and 71b and another pair of magnetic gears are configured with the second magnetic body 62 and the third magnetic bodies 71a and 71b, so that the first and second magnetic bodies 61 and 62 and the third magnetic bodies 71a and 71b construct the two pairs of magnetic gears. However, in order to install the third magnetic bodies 71a and 71b in common with respect to the first and second magnetic bodies 61 and 62, the first and second magnetic bodies 61 and 62 should be synchronously rotated in opposite directions with the third magnetic bodies 71a and 71b interposed therebetween. Accordingly, the first and second magnetic bodies 61 and 62 are prevented from being separately and independently rotated, so that the magnetic gear 60 having the first and second magnetic bodies 61 and 62 and the third magnetic bodies 71a and 71b functions as a posture holding device of the wafer transfer device 30.

The attractive forces interacting between the first and second magnetic bodies 61 and 62 and the third magnetic bodies 71a and 71h are set to be values which causes the magnetic gear 60 to be out of phase when the a predetermined torque is exerted to the magnetic gear 60. Accordingly, the gap G between the first and second magnetic bodies 61 and 62, the intensity of the magnetic force of each of the magnetic pole pairs 70 and 72 is appropriately set according to the predetermined value of torque causing the magnetic gear 60 to be out of phase.

Figure 6:
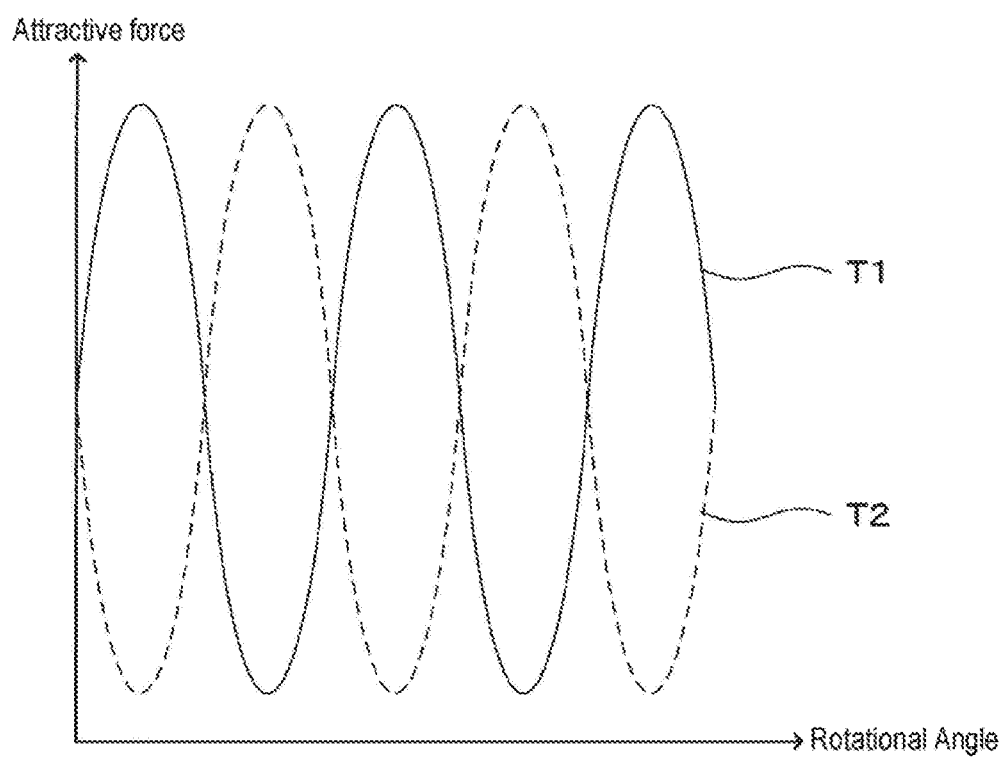
FIG. 6 is a graph illustrating changes in attractive forces interacted between the first and second magnetic bodies and the third magnetic body.

As exemplarily shown in FIG. 4, the two third magnetic bodies 71a and 71b are disposed at positions offset by an angle θ from extension lines of the respective supporting shafts 73 thereof. Further, the third magnetic bodies 71a and 71b are disposed such that the extension lines of the respective supporting shafts 73 thereof intersect with the central axis B of the first and second magnetic bodies 61 and 62. This angle θ is set such that when positions corresponding to intermediate portions of the magnetic pole pair 72 are located at upper and lower ends of one of the third magnetic bodies 71a as exemplarily shown in FIG. 3, the center of either magnetic pole of the magnetic pole pair 72 is positioned at upper and lower ends of the other third magnetic body 71b as exemplarily shown in FIG. 5. More specifically, as exemplarily shown in FIG. 6, if the horizontal axis represents a rotation angle of the magnetic gear 60 and the vertical axis represents attractive forces between the third magnetic bodies 71a and 71b and the first and second magnetic bodies 61 and 62, for example, an attraction force T1 between the first and second magnetic bodies 61 and 62 and one of the third magnetic bodies 71a, the attractive force T1 increases and decreases in the shape of a trigonometric function. Further, for example, if the attractive force T1 is a trigonometric function with a period of $2\pi$, the angle $\theta$ is set such that the phase of another attractive force 12 between the first and second magnetic bodies 61 and 62 and the other third magnetic body 71b is shifted by $\pi$ from that of the attractive force T1. For example, when the third magnetic body 71a and the first and second magnetic bodies 61 and 62 are in the state shown in FIG. 3, the attractive force T1 has its minimum value while the attractive force 12 of which phase is shifted by $\pi$ and which results from the other third magnetic body 71b has its maximum value. Accordingly, holding and supporting forces by the magnetic gear 60 as a whole, i.e., by the two third magnetic bodies 71a and 71b and the first and second magnetic bodies 61 and 62 may be maintained to be generally constant, thereby stably supporting the first link 52 and the second link 53.

The substrate processing system 1 according to this embodiment is configured as described above. Subsequently, the operation of the transfer device 30 in the substrate processing system 1 will be described.

If a cassette C is transferred into the cassette station 2 of the substrate processing system 1, the wafer W in the cassette C is appropriately transferred into the load lock chamber 4 by the wafer transfer arm 12. Subsequently, the wafer transfer device 30 in the vacuum transfer chamber 21 allows the respective links 52 and 53 and the respective arms 41a and 41b to be extended from a state where the first link 52, the second link 53 and the respective arms 41a and 41b are retracted as exemplarily shown in FIG. 7 to a state exemplarily shown in FIG. 8, so that the wafer transfer device 30 receives the wafer W from the load lock chamber 4. Subsequently, the wafer transfer device 30 carries the wafer W into each of the processing chambers 20 where timely processing on the wafer W may be performed.

Figure 9:
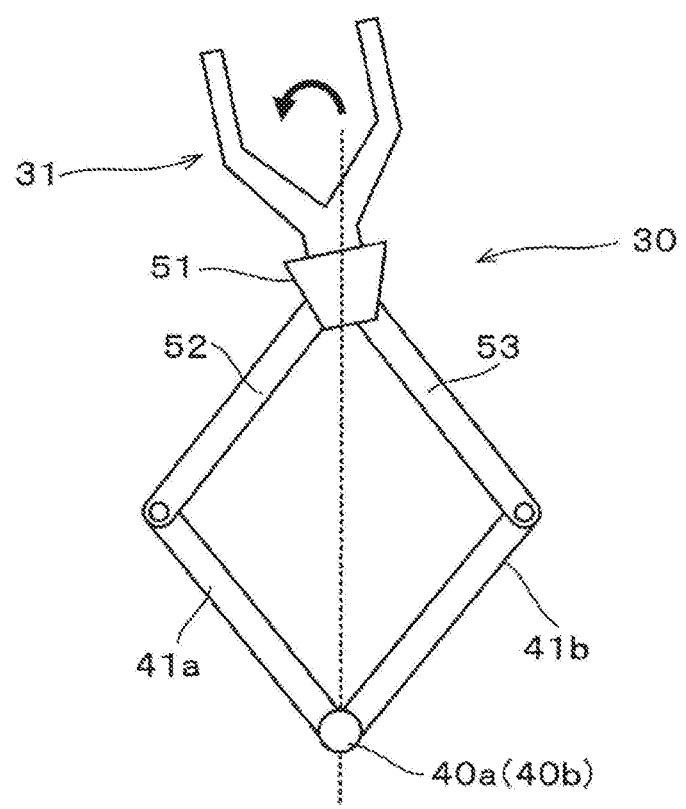
FIG. 9 is an explanatory plan view illustrating a state of the wafer transfer device when the magnetic gear is out of phase.

At this time, if the operation of the wafer transfer device 30 is abnormal due to a possible problem, in order for the main body 50 of the fork 31 to come into contact with a wall surface of the vacuum transfer chamber 21 to cause certain torque to be exerted to the fork 31, the respective links 52 and 53 or the respective arms 41a and 41b, the magnetic gear 60 is out of phase so that only the fork 31 may be rotated as exemplarily shown in FIG. 9. With this, the posture of the fork 31 in the wafer transfer device 30 is normally maintained in a desired state, whereas upon the exertion of certain torque to the fork 31 or the like, the magnetic gear 60 is out of phase, thereby preventing the wafer transfer device 30 from being broken.

Since the aforementioned embodiment has the magnetic gear 60 for rotatably connecting the fork 31 to the first and second links 52 and 53, the magnetic gear 60 may be out of phase even when, for example, a problem occurring in the wafer transfer device 30 causes the fork 31 to come into contact with a certain structure so that excessive torque may be exerted to the fork 31. For this reason, the torque exerted to the fork 31 is not transmitted to the respective links 52 and 53 or the respective arms 41a and 41b, which are connected to the fork 31. Accordingly, the water transfer device 30 is not broken even when excessive torque is exerted to the fork 31 in accordance with the present disclosure.

Further, since the respective links 52 and 53 and the fork 31 are connected in a not contact manner with the magnetic gear 60 interposed therebetween and there is no slidable part such as that included in a conventional wafer transfer device, particles that might be generated from the slidable part included in the conventional wafer transfer device are not generated even when the wafer transfer device 30 is operated. Accordingly, the substrate processing system 1 is maintained to be clean so that the contamination of the wafer W due to the particles may be restrained to a minimum. Further, due to the noncontact manner, for example, an operation of supplementing a lubricant such as grease into the slidable part is not required, or for example, factors that might influence the degree of carrying accuracy such as a change in sliding resistance due to heat may be restrained to a minimum.

Further, since the third magnetic bodies 71a and 71b are disposed at two positions of which phases are shifted by $\pi$ from each other in the embodiment described above, the holding and supporting force of the fork 31 and the first and second links 52 and 53 by means of the magnetic gear 60 can be maintained to be generally constant. As a result, the fork 31 can be stably maintained.

Further, although FIG. 4 shows a state where the angle $\theta$ becomes minimal when one of the third magnetic bodies 71a and the other third magnetic body 71b are angularly offset by the angle $\theta$ in the embodiment described above, the set value of the angle $\theta$ is not limited to the present embodiment but the angle $\theta$ may be arbitrarily set as long as the phases of the attractive forces T1 and 12 by the third magnetic body 71a and the other third magnetic body 71b can be kept shifted from each other by $\pi$. Further, if the angle $\theta$ is too large, i.e., the angle $\theta$ approaches 180 degrees, the support of the fork 31 by the magnetic gear 60 approaches a one-sided fixing state. Accordingly, it is preferable that the angle $\theta$ is reduced as much as possible from the viewpoint of stable retention of the fork 31.

Further, although the magnetic gear 60 has the two third magnetic bodies 71a and 71b in the embodiment described above, the two third magnetic bodies 71a and 71b are not necessarily installed, and it will be sufficient that there is any one of the third magnetic bodies 71a and 71b from the viewpoint of maintaining the posture of the fork 31 in a desired state by synchronizing the operations of the respective links 52 and 53. On the contrary, the number of the third magnetic bodies 71a and 71b to be installed cannot be necessarily two or less, and three or more third magnetic bodies 71a and 71b may be installed. In this case, it is preferable that the number of the third magnetic bodies 71a to be installed is equal to that of the third magnetic bodies 71b to be installed from the viewpoint of maintaining the sum of the attractive forces T1 and T2 to be generally constant by shifting the phases of the attractive forces from each other. In other words, if a plurality of third magnetic bodies 71a and 71h are installed, it is preferable that an even number of third magnetic bodies are installed.

Figure 7:
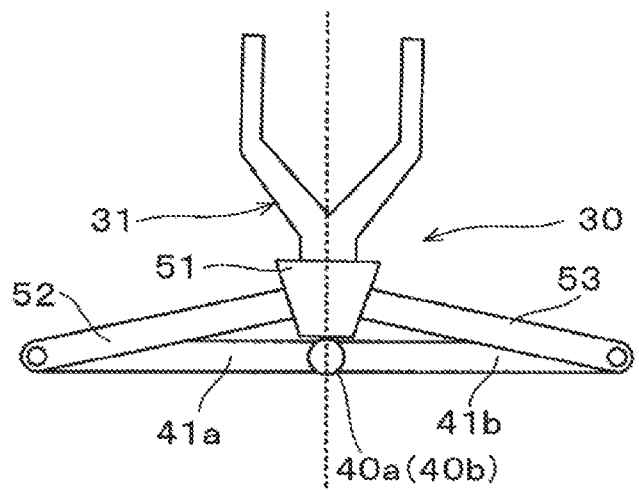
FIG. 7 is an explanatory plan view illustrating a state where the wafer transfer device is at a standby position.
Figure 8:
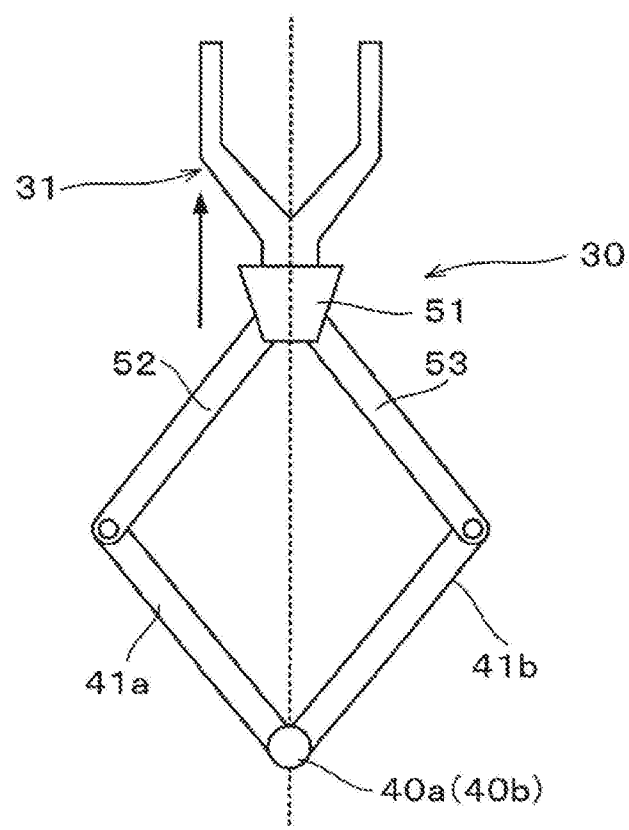
FIG. 8 is an explanatory plan view illustrating a state where the wafer transfer device is at a transfer position.
Figure 10:
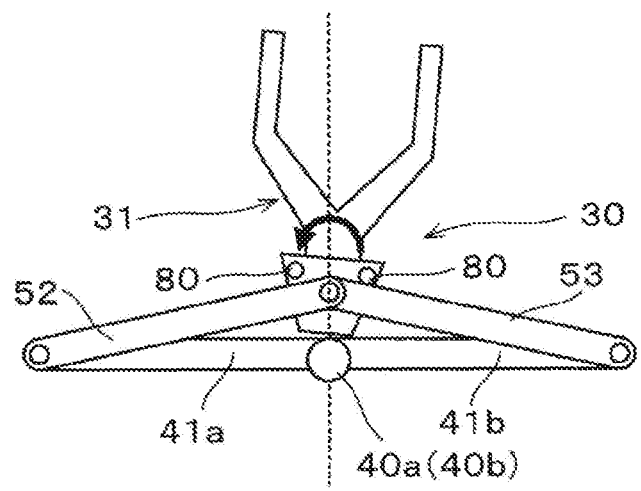
FIG. 10 is an explanatory plan view illustrating the wafer transfer device having interference members.

Further, although the out-of-phase state of the fork 31 caused by the magnetic gear 60 upon exertion of excessive torque to the fork 31 has been described in the aforementioned embodiment, a posture holding member which serves to restore the fork 31 in the out-of-phase state to a desired state may be provided. Specifically, if the state where the respective links 52 and 53 and the respective arms 41a and 41b are retracted as exemplarily shown in FIG. 7 is referred as a standby position of the fork 31 while the state where the respective links 52 and 53 and the respective arms 41a and 41b are extended as exemplarily shown in FIG. 8 is referred as a transfer position of the fork 31, interference members 80 as the posture holding member may be installed on the supporting plate 51 at positions where the interference members interfere with the respective links 52 and 53 when the fork 31 is restored to the standby position from a state where the magnetic gear 60 is out of phase so that the fork 31 is slanted as exemplarily shown in FIG. 10. With this, for example, in the course of restoration of the supporting plate 51, which has been out of phase and slanted at the transfer position, to the standby position, the slope of the fork 31 is corrected so that the fork 31 may be maintained in a desired state in a subsequent carrying operation. Further, it is preferable that rotatable rollers are used as the interference members 80, for example. The use of the rollers can restrain sliding to a minimum when interference members 80 and the respective links 52 and 53 are in contact with each other.

Figure 11:
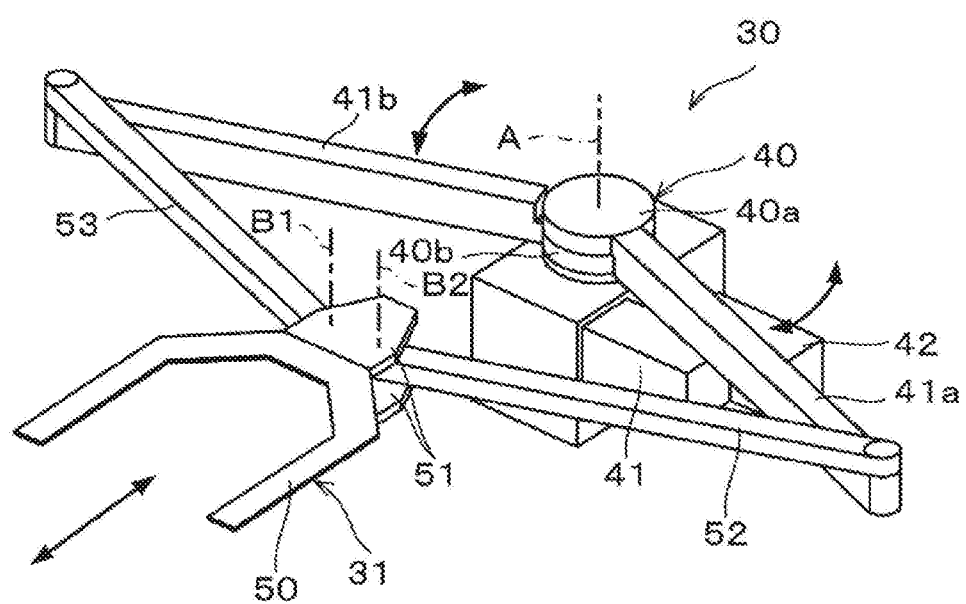
FIG. 11 is a perspective view schematically illustrating a configuration of a transfer device having a posture holding device according to another embodiment of the present disclosure.

Further, although the third magnetic bodies are disposed between the first and second magnetic bodies 61 and 62 and the rotation axes of the first and second magnetic bodies 61 and 62 are adapted to coincide with the central axis B, in other words, the rotation axes of the connecting portions of the respective links 52 and 53 to the supporting plates 51 are adapted to coincide with each other in the aforementioned embodiments, the rotation axes of the respective links 52 and 53 may be different from each other, for example, as shown by B1 and B2 in FIG. 11. In this case, instead of the magnetic gear 60, another magnetic gear 110 is used, wherein the other magnetic gear 110 includes first and second magnetic bodies 100 and 101 having the central axes B1 (first axis) and B2 (second axis) as their rotation axes, respectively, and connected to the supporting plates 51 via thrust bearings 64, as exemplarily shown in FIGS. 12 and 13. The first and second magnetic bodies 100 and 101 are equal or similar to the first and second magnetic bodies 61 and 62, and each of the first and second magnetic bodies 100 and 101 is configured by disposing a plurality of magnetic pole pairs 70 on a disc-shaped supporting plate 63 in a circumferential direction.

Figure 12:
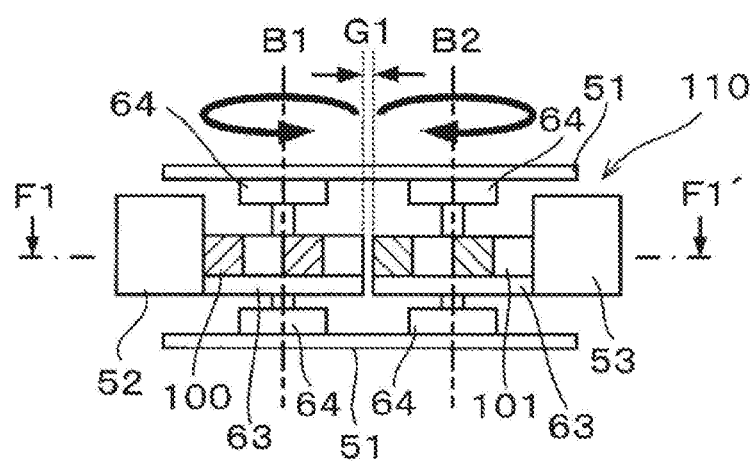
FIG. 12 is an explanatory side view schematically illustrating a configuration around a magnetic gear according to another embodiment of the present disclosure.
Figure 13:
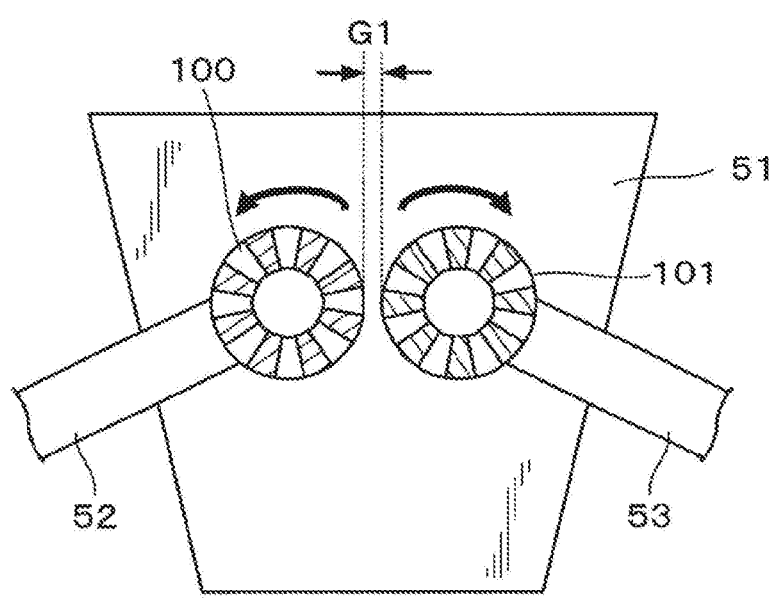
FIG. 13 is a sectional view taken along line F-F' of FIG. 12 and shown in a direction designated by arrows, schematically illustrating the configuration around the magnetic gear according to the other embodiment of the present disclosure.

The first and second magnetic bodies 100 and 101 are disposed at positions approximately flush with each other in a vertical direction as shown in FIG. 12. Further, the first and second magnetic bodies 100 and 101 are disposed to be spaced apart from each other by a predetermined gap G1 in a horizontal direction. This gap G1 is set such that for example, when any one of the first and second magnetic bodies 100 and 101 is rotated, reverse torque is exerted to the other of the first and second magnetic bodies 100 and 101. For example, if the second magnetic body 101 in the magnetic gear 110 having such a configuration is rotated clockwise in response to the rotation of the second link 53 as shown in FIG. 13, the first magnetic body 100 is rotated counterclockwise in synchronization with the second magnetic body 101. Accordingly, the magnetic gear 110 also functions a posture holding device of the wafer transfer device 30 for preventing the first and second magnetic bodies 100 and 101 from being separately and independently rotated.

Figure 14:
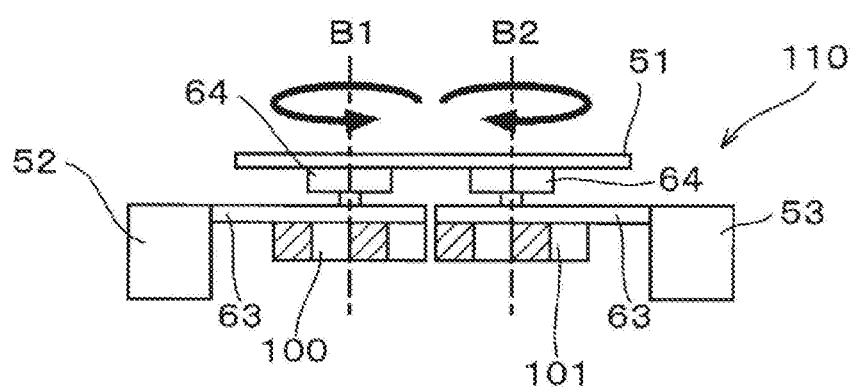
FIG. 14 is an explanatory side view schematically illustrating a configuration around a magnetic gear according to a further embodiment of the present disclosure.

Further, although the magnetic gear 110 illustrated in FIG. 12 is shown in a state where the first and second magnetic bodies 100 and 101 are supported by both supporting plates 51 installed in the up and down direction, both the first and second magnetic bodies 100 and 101 may be supported only by either of the upper and lower supporting plates 51 as exemplarily shown in FIG. 14. FIG. 14 shows a state where the first and second magnetic bodies 100 and 101 are supported only by the upper supporting plate 51. If excessive torque is exerted to the fork 31 even in all the embodiments shown in FIGS. 12 and 14, the magnetic gear 110 may also be brought into the out-of-phase state, thereby preventing breakage of the wafer transfer device 30. Further, the interference member 80 may be also used to restore the slope of the fork 31 in the out-of-phase state even in the wafer transfer device 30 employing the magnetic gear 110.

According to the present disclosure in some embodiments, it is possible to prevent the transfer device from being broken due to excessive torque applied to the holding part of the transfer device.

Although the aforementioned embodiments have been described by way of example in connection with the cases where the semiconductor wafers are transferred by the wafer transfer device 30, the present disclosure may be also applied to, for example, a case where glass substrates for liquid crystal panels are transferred.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A posture holding device for use in a transfer device, the transfer device having a holding part configured to hold an object to be transferred, a first link with one end connected to the holding part, and a second link with one end connected to the holding part, the transfer device being configured to move the first link and the second link relative to the holding part so as to move the holding part between a transfer position and a standby position, the posture holding device being configured to hold a posture of the holding part, the posture holding device comprising:
   a magnetic gear configured to rotatably connect the one end of the first link and the one end of the second link to the holding part, wherein the magnetic gear comprises:
      first and second disc-shaped magnetic bodies disposed opposite to each other on a first axis, and
      a third cylindrical magnetic body disposed between the first magnetic body and the second magnetic body,
   wherein the magnetic gear is disposed such that the one end of the first link connected to the holding part is rotated about the first axis and the one end of the second link connected to the holding part is rotated about the first axis or a second axis different from the first axis,
   and wherein the third magnetic body is disposed such that a central axis of the third magnetic body is in parallel with the first and second magnetic bodies and also intersects with the first axis of the first and second magnetic bodies, the first magnetic body is supported by the first link, the second magnetic body is supported by the second link, and the third magnetic body is supported by the holding part.

2. The posture holding device of claim 1, wherein an even number of third magnetic bodies are installed, and a half of the third magnetic bodies are disposed on magnetic poles different from those of the other half of the third magnetic bodies.

3. The posture holding device of claim 1, wherein the first disc-shaped magnetic body is configured to rotate about the first axis, and
   the second disc-shaped magnetic body is configured to rotate about the second axis,
   wherein the first and second magnetic bodies are disposed at positions flush with each other to be spaced apart from each other by a predetermined gap in a horizontal direction.

4. The posture holding device of claim 1, wherein an interference member configured to restore an out-of-phase state of the holding part is installed on the holding part.

* * * * *